(12) United States Patent
Kuribayashi et al.

(10) Patent No.: US 10,738,987 B2
(45) Date of Patent: Aug. 11, 2020

(54) LIGHT EMITTING DEVICE

(71) Applicant: NICHIA CORPORATION, Anan-shi, Tokushima (JP)

(72) Inventors: Wataru Kuribayashi, Anan (JP); Takashi Miyoshi, Anan (JP); Naoto Morizumi, Yoshinogawa (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/046,681

(22) Filed: Jul. 26, 2018

(65) Prior Publication Data

US 2019/0032907 A1    Jan. 31, 2019

(30) Foreign Application Priority Data

Jul. 28, 2017   (JP) .................. 2017-146624

(51) Int. Cl.
| | |
|---|---|
| *F21V 29/10* | (2015.01) |
| *F21K 9/64* | (2016.01) |
| *H01S 5/06* | (2006.01) |
| *H01L 31/147* | (2006.01) |
| *F21V 23/04* | (2006.01) |
| *H01S 5/022* | (2006.01) |
| *F21V 3/08* | (2018.01) |
| *H01S 5/00* | (2006.01) |
| *F21Y 115/30* | (2016.01) |
| *F21S 41/176* | (2018.01) |

(Continued)

(52) U.S. Cl.
CPC ............... *F21V 29/10* (2015.01); *F21K 9/64* (2016.08); *F21V 3/08* (2018.02); *F21V 23/0457* (2013.01); *H01L 31/147* (2013.01); *H01S 5/02248* (2013.01); *H01S 5/02296* (2013.01); *H01S 5/06* (2013.01); *F21S 41/16* (2018.01); *F21S 41/176* (2018.01); *F21S 45/70* (2018.01); *F21V 5/008* (2013.01); *F21Y 2115/30* (2016.08); *H01S 5/005* (2013.01); *H01S 5/02212* (2013.01); *H01S 5/0683* (2013.01); *H01S 5/06825* (2013.01); *H01S 5/32341* (2013.01)

(58) Field of Classification Search
None
See application file for complete search history.

(56) References Cited

U.S. PATENT DOCUMENTS

| 9,625,113 B2 * | 4/2017 | Mitterlehner ........ G02B 26/105 |
| 10,220,779 B2 * | 3/2019 | Ichikawa ............ H01S 5/06825 |

(Continued)

FOREIGN PATENT DOCUMENTS

| JP | H06-152067 A | 5/1994 |
| JP | 2001-250255 A | 9/2001 |

(Continued)

*Primary Examiner* — Dedei K Hammond
(74) *Attorney, Agent, or Firm* — Global IP Counselors, LLP

(57) ABSTRACT

A light emitting device includes a semiconductor light emitting element to emit an excitation light, a wavelength converting member to emit fluorescent light upon being irradiated with the excitation light, a package supporting the semiconductor light emitting element and the wavelength converting member, and a first photodetector configured to detect the excitation light and a second photodetector to detect the fluorescent light, located in the package.

19 Claims, 4 Drawing Sheets

(51) Int. Cl.
*F21V 5/00* (2018.01)
*F21S 45/70* (2018.01)
*H01S 5/323* (2006.01)
*H01S 5/0683* (2006.01)
*F21S 41/16* (2018.01)
*H01S 5/068* (2006.01)

(56) References Cited

U.S. PATENT DOCUMENTS

| | | | |
|---|---|---|---|
| 2004/0234270 | A1 | 11/2004 | Nishie et al. |
| 2009/0274420 | A1* | 11/2009 | Vallee ................ G02B 6/02133 385/37 |
| 2011/0063115 | A1 | 3/2011 | Kishimoto |
| 2011/0084609 | A1* | 4/2011 | Kawaguchi ......... F21V 23/0442 315/77 |
| 2012/0230007 | A1 | 9/2012 | Kawakami |
| 2015/0098241 | A1* | 4/2015 | Nakano ................ G02B 6/4204 362/581 |
| 2016/0149097 | A1* | 5/2016 | Saka .................. C23C 16/4417 257/98 |
| 2018/0017220 | A1* | 1/2018 | Kitano ................. F21V 29/763 |

FOREIGN PATENT DOCUMENTS

| | | |
|---|---|---|
| JP | 2004-294513 A | 10/2004 |
| JP | 2006-165598 A | 6/2006 |
| JP | 2011-066069 A | 3/2011 |
| JP | 2011-527518 A | 10/2011 |
| JP | 2012-190628 A | 10/2012 |
| JP | 2013-191479 A | 9/2013 |
| WO | 2010004477 A2 | 1/2010 |

* cited by examiner

LIGHT EMITTING DEVICE

CROSS-REFERENCE TO RELATED PATENT APPLICATION

This application claims priority to Japanese Patent Application No. 2017-146624 filed on Jul. 28, 2017. The entire disclosure of Japanese Patent Application No. 2017-146624 is hereby incorporated herein by reference.

BACKGROUND

Technical Field

The present disclosure relates to a light emitting device.

Description of Related Art

There has been known a semiconductor light emitting device for a white light source, in which a visible-light laser diode is used as a semiconductor light emitting element, a wavelength converting member is fixedly arranged to a transparent cap disposed in a light-emitting direction of the laser diode to obtain a mixed color light of white light.

SUMMARY OF THE INVENTION

However, with such a structure, the wavelength converting member may be detached or damaged, which may cause the laser light from the laser diode directly leak to the outside.

With an aim of preventing direct emission of a laser light to the outside of a light emitting device, configurations provided with an optical detector has been proposed (see Japanese Unexamined Patent Application Publication No. 2006-165598 and Japanese Unexamined Patent Application Publication No. 2011-66069).

However, demands for light emitting devices of higher optical output and higher reliability requires not only prevention of unintended emission of laser light to the outside but also prevention of degradation of luminous flux due to degradation of thermal characteristics results from damage of the wavelength converting member.

It is an object of the present disclosure to provide a light emitting device having high optical output, high safety, and high reliability.

A light emitting device according to certain embodiments of the present disclosure includes a semiconductor light emitting element to emit an excitation light, a wavelength converting member including a fluorescent material and being configured to emit fluorescent light upon being irradiated with the excitation light, a package supporting the semiconductor light emitting element and the wavelength converting member, and a first photodetector to detect the excitation light and a second photodetector to detect the fluorescent material, disposed in the package.

The present disclosure can provide a light emitting device in which detachment or the like of a wavelength converting member can be immediately detected and higher optical output, higher safety, and higher reliability can be provided.

DETAILED DESCRIPTION OF EMBODIMENTS

Figure 1A:
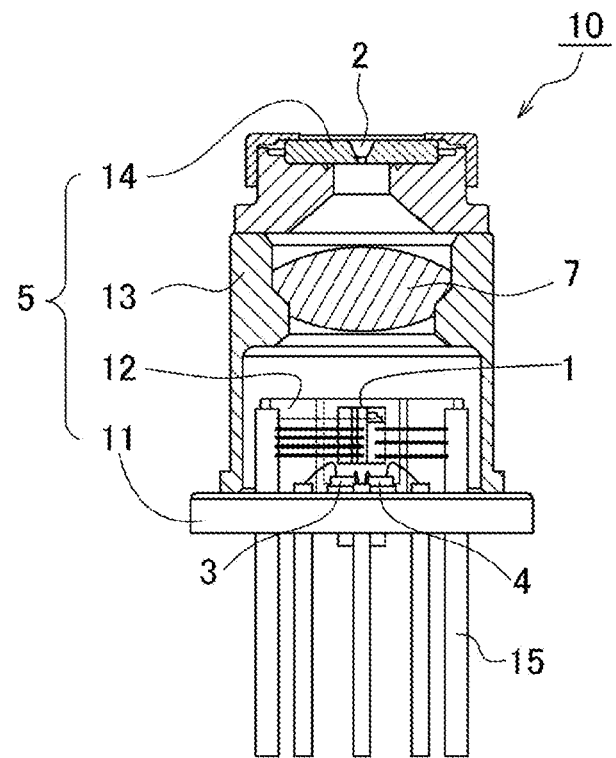
FIG. 1A is a schematic cross-sectional view of a light emitting device according to a first embodiment.

The embodiments shown below are intended as illustrative to give a concrete form to technical ideas of the present invention, and the scope of the invention is not limited to those described below. The sizes and the positional relationships of the members in each of the drawings are occasionally shown exaggerated for ease of explanation. Further, in the description below, the same designations or the same reference numerals denote the same or like members and duplicative descriptions will be appropriately omitted.

First Embodiment

Figure 3:
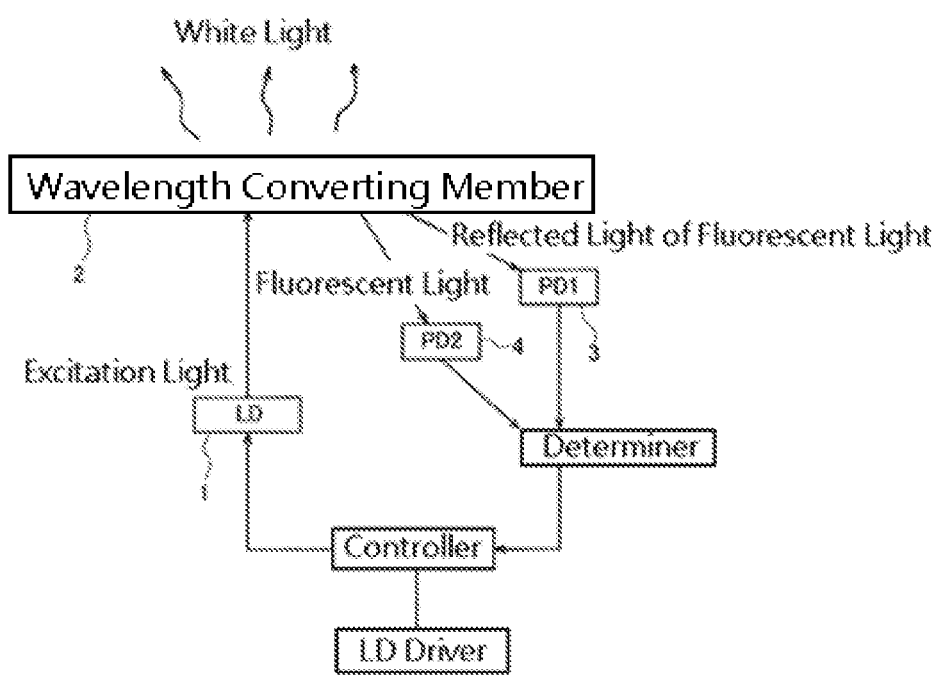
FIG. 3 is a block diagram of the light emitting device according to the first embodiment.

As shown in FIGS. 1A and 3, the light emitting device 10 according to the first embodiment is a transmission type light emitting device and includes a semiconductor light emitting element 1 to emit excitation light, a wavelength converting member 2 to emit fluorescent light, a first photodetector 3 to detect the excitation light, and a second photodetector 4 to detect the fluorescent light. The semiconductor light emitting element 1, the wavelength converting member 2, the first photodetector 3, and the second photodetector 4 are disposed in the package 5 and supported by the package 5.

As described above, having at least two photodetectors to detect light of at least two wavelengths; the photodetector to detect the excitation light and the photodetector to detect the fluorescent light, allows for simultaneous detection of light being reflected in the package and light entering the package (the excitation light and the fluorescent light). With this configuration, abnormality such as degradation, cracking, or detachment of the fluorescent material can be immediately detected. Detection of such an abnormality allows for taking appropriate measures such as stopping the driving of the semiconductor light emitting element, and thus the light emitting device of high optical output with high safety and high reliability can be obtained. Continuous driving may produce a change in temperature of a light emitting device, or an operating environment may be associated with temperature variation, but the light emitting device according to the first embodiment can maintain high optical output with high safety and high reliability in a wide environmental temperature range from low temperature to high temperature.

Semiconductor Light Emitting Element 1

The semiconductor light emitting element 1 can be selected from various types of light emitting elements each configured to emit an excitation light, such as a light emitting diode, and a semiconductor light emitting element. In particular, immediate detection of detachment or damage of a wavelength converting member to be described later below can be achieved in the light emitting device 10 according to the first embodiment, and thus suitable to employ a semiconductor laser that is harmful to human body when irradiated directly.

The semiconductor light emitting element 1 may have a peak emission wavelength in a range of 300 nm to 500 nm, preferably in a range of 400 nm to 470 nm, more preferably in a range of 420 nm to 470 nm. Typically, an edge-emitting semiconductor laser element can be used. Accordingly, an optical output of the light emitting device can be improved. A high-output semiconductor laser element can be used, and for example, a single semiconductor laser element with an output in a range of 1 W to 100 W can be used.

In the first embodiment, with the use of a die-bonding material, the semiconductor light emitting element 1 is fixed to the package 5 to be described below, especially to a block part 12 of the stem of the package 5. Examples of the die-bonding material include Ag-paste, an In alloy, and a solder material having good heat dissipating properties such as Au—Sn.

Wavelength Converting Member 2

In order to receive the excitation light from the semiconductor light emitting element 1, the wavelength converting member 2 is arranged at a forward side of the emission end of the excitation light of the semiconductor light emitting element 1. The wavelength converting member 2 contains a fluorescent material to absorb the excitation light from the semiconductor light emitting element 1 and emit light (fluorescent light) of different wavelength. In the light emitting device 1 according to the first embodiment, a fluorescent material is contained in the wavelength converting member 2 that is disposed to close a through-hole formed in the support member 14 of the package 5 to be described later below. Accordingly, mixed-color light of the light from the semiconductor light emitting element 1 and the wavelength converted light from the wavelength converting member 2, for example, a white light can be transmitted and extracted to the outside. The color of light to be extracted can be appropriately adjusted by selecting the type of the semiconductor light emitting element and the type of the fluorescent material.

Any known fluorescent material can be used, for example, according to the wavelength of light from the light source to be used, color of light to be obtained, and so forth. Examples of the fluorescent material include a yttrium aluminum garnet (YAG)-based fluorescent material activated with cerium, a lutetium aluminum garnet (LAG)-based fluorescent material activated with cerium, a nitrogen-containing calcium aluminosilicate ($CaO$—$Al_2O_3$—$SiO_2$) activated with europium and/or chromium, a silicate (($Sr,Ba)_2SiO_4$) activated with europium, a β-sialon-based fluorescent material, and a KSF ($K_2SiF_6$:Mn)-system fluorescent material. Among those, a fluorescent material that has good heat-resisting properties is preferable.

The use of such a fluorescent material allows for obtaining of a light emitting device to emit light of mixed color having a visible wavelength (for example, a while light) of excitation light and fluorescent light, or a light emitting device to emit fluorescent light having a visible wavelength upon being excited by an excitation light in the ultraviolet region. In particular, for the fluorescent material to be used in combination with a blue light emitting element to emit white light, a fluorescent material which can be excited by a blue light and emits yellow light with broad spectrum may be preferably used.

In the wavelength converting member 2 having a single layer structure, a single fluorescent material may be used, or a combination of several fluorescent materials may be used. In the wavelength converting member 2 having a layered structure, different fluorescent materials may be contained in respective layers.

For example, in conformity with the emission wavelength of the semiconductor light emitting element 1, the amounts of the fluorescent materials having different chromaticity coordinates on the CIE chromaticity diagram are adjusted and contained in the wavelength converting member. This allows for obtaining light of a desired color within a range defined by connecting the chromaticity coordinates of the fluorescent materials and the semiconductor light emitting element 1 on the chromaticity diagram. The fluorescent material(s) is preferably uniformly dispersed in a single layer structure or in a layered structure. This allows for uniform wavelength conversion regardless of the portions in the wavelength converting member 2 and thus light of a uniform mixed color can be obtained.

The fluorescent material preferably has an average particle diameter (median particle diameter) of 1 μm or greater. Among those, a fluorescent material having a relatively large average particle diameter is preferable, for example, an average particle diameter of 10 μm or greater, 12 μm or greater is preferable. Also, the median particle diameter of 50 μm or less, 30 μm or less, or 25 μm or less is preferable. The average particle diameter may be indicated as a F.S.S.No (Fisher Sub Sieve Sizer's No) that is determined by using an air permeable method. As described above, with the use of the fluorescent material having a relatively large average particle diameter, generation of heat due to the light from the semiconductor light emitting element 1 can be reduced, and dissipation of heat from the wavelength converting member 2 can be facilitated.

The amount of the fluorescent material contained in the wavelength converting member 2 is preferably in a range of 0.05 weight % to 50 weight %, more preferably in a range of 1 weight % to 15 weight %.

The fluorescent material(s) is, for example, dispersed in a light-transmissive member to constitute the wavelength converting member 2. The light-transmissive member is preferably made of a material having good optical transmittance. For example, the optical transmittance is preferably such that 50% or greater, 60% or greater, 70% or greater, or 80% or greater light emitted from a light source to be used, for example, a laser diode, can be transmitted through the light-transmissive member. Also, the wavelength converting member 2 is preferably made of a material having good light-resisting properties and heat-resisting properties so as not to experience deformation upon being irradiated by light of high output power. For example, a material having a melting point in a range of 1,000° C. to 3,000° C. can be employed.

Examples of the material of the light-transmissive member include glass and ceramics. Examples of the ceramics include aluminum oxide (such as alumina and sapphire), silicon dioxide, zirconium oxide, barium oxide, titanium oxide, yttrium oxide, silicon nitride, aluminum nitride, and silicon carbide. Those materials may be used singly or a combination of two or more. Among those, good light-transmissive property and from view-points of melting point, thermal conductive property, light-diffusing property, and so forth, material that contains aluminum oxide and/or silicon dioxide is preferable, and a material containing aluminum oxide is more preferable. The light-transmissive member may have a single layer structure or a layered structure made of made of a single material or a plurality of materials.

The wavelength converting member made of the material as described above can sustain high temperature due to higher output of the semiconductor laser element 1 and avoid melting, and further, deformation and discoloration of the wavelength converting member can also be avoided. Accordingly, the optical characteristics of the light emitting device can be maintained for a long period of time. Further, employing such a material that also has good thermal conductivity, heat due to the semiconductor light emitting element 1 can be released efficiently.

The light light-transmissive member may include a light scattering material as needed. The light scattering material of high melting point and certain degree of difference in the refractive index with respect to the materials constituting the light-transmissive member can be employed. For the light scattering material, aluminum oxide, silicon oxide, or titanium oxide with certain degree of difference in the refractive index with respect to the light-transmissive member can be employed. The content amount of the light scattering material can be appropriately determined. For example, an amount of the light scattering material can be less than the amount of the material of the light transmissive member.

With the use of a light scattering material and a fluorescent material, light from the semiconductor light emitting element 1 and the fluorescent material can be diffusely reflected more sufficiently, which allows for a reduction of uneven color that tends to occur with the use of a fluorescent material having a large particle diameter.

Package 5

The package 5 is configured to support the semiconductor light emitting element 1 and the wavelength converting member 2 as described above, and a first photodetector 3 and a second photodetector 4 to be described below, and is formed with a stem having a base part 11 and a block part 12, a cap 13, and a support 14.

Figure 1B:
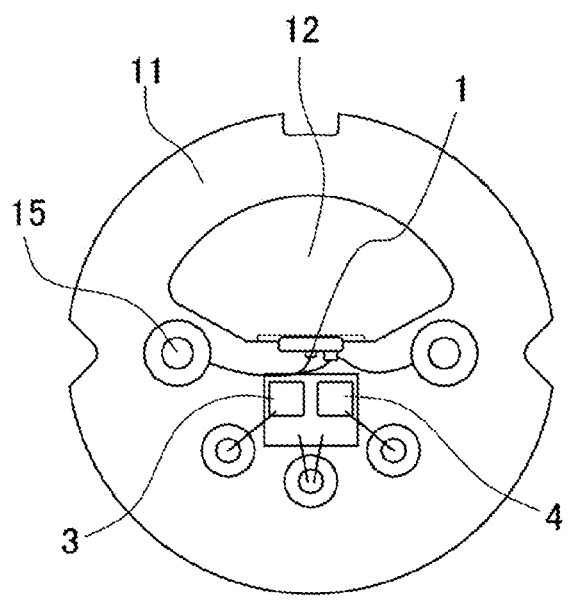
FIG. 1B is a schematic plan view illustrating a configuration near a stem of the light emitting device according to the first embodiment.

In the light emitting device 10, as shown in FIG. 1A and FIG. 1B, a block part 12 of the stem is arranged perpendicularly on an upper surface of the base 11 of the stem. The semiconductor light emitting element 1 is fixed on a lateral surface of the block part 12 of the stem, but the semiconductor light emitting element may be fixed via a sub-mount on a lateral surface of the block part 12 of the stem.

A hollow cap 13 covering the semiconductor light emitting element 1 is bonded on an upper surface of the base part 11 near outer periphery of the base part 11 of the stem. A support member 14 is arranged above an upper surface of the cap 13 and at a location opposite to the semiconductor light emitting element 1. The support member 14 defines a through-window formed through in its thickness direction to extract light. The wavelength converting member 2 containing the fluorescent material is fixed to cover the through-window of the support member 14. The through-window is defined by an inner wall tapering that is reverse tapering with an opening diameter increasing upward from the semiconductor light emitting element 1 side. With this arrangement, a ratio of light incident on the wavelength converting member 2 and a light extraction efficiency from the wavelength converting member 2 can be increased. Further, the light extracted from the light emitting device 10 to the outside is diffused light that has been reflected multiple times in the wavelength converting member 2, and thus can reduce danger on a human body.

Along the thickness direction of the base part 11 of the stem, a plurality of leads 15 are disposed through the upper surface and the lower surface of the base part 11 of the stem and fixed to the base part 11 of the stem. Inner lead portions of the leads 15 protruded at the upper surface side of the base part 11 of the stem are electrically connected to the semiconductor light emitting element 1 via wires respectively. Portions of the leads at the lower surface side of the base part 11 of the stem are connected to a wiring substrate or the like, and electrically connected to external electrodes respectively.

The stem (the base part 11 and the block part 12), the cap 13, and the support member 14 are preferably formed with light-reflecting materials that hardly absorb light. In the specification, the expression "reflecting material" refers to a material that can reflect preferably 50% or greater, 60% or greater, 70% or greater, or 80% or greater of light emitted from the semiconductor laser element 1 to be used. In the light emitting device 10, heat generated from the wavelength converting member 2 is transferred to the base part 11 of the stem through the cap 13. Meanwhile, heat generated from the semiconductor light emitting element 1 is transferred to the base part 11 of the stem through the block part 12 of the stem. Thus, the package 5 is used as a heat dissipating member and therefore preferably made of a material having good thermal conductive property. In the specification, the expression "good thermal conductive property" refers to a thermal conductivity at 20° C. of several watts per meter per Kelvin (W/(m·k)) or greater, more preferably 10 W/m·K or greater, or 25 W/m·K or greater, further preferably 50 W/m·K or greater. In this case, the stem (the base part 11 and the block part 12), the cap 13, and the support member 14 are preferably formed with materials respectively having a thermal conductivity greater than that of the wavelength converting member 2. Accordingly, the heat of the wavelength converting member 2 can be dissipated efficiently. The package 5 is preferably made of a material having good heat-resisting property. In the specification, the expression "good heat-resisting property" refers to a material having a melting point of, preferably, several hundred Celsius degrees or greater, more preferably 1,000° C. or greater, further preferably 1,500° C. or greater.

The package 5 can be made of a material selected from various materials of electrically conducting property or electrically insulating property.

Examples of the materials of the stem (the base part 11 and the block part 12) include a metal such as Cu, W, Ta, Mo, Al, Fe, Ag, Au, Rh, kovar, brass, CuW, and CuMo. Such a metal may be used as a base material and plating of Au, Ag, Al or the like may be applied on the entire surfaces or a portion of the surfaces of the base material. Among those, copper or copper alloy whose surfaces are plated with gold is preferable. In particular, the base part 11 of the stem will be bonded with the cap 13, so that at least the upper surface of the base 11 of the stem is preferably made of a material that has good bonding property with the material of the surface of the cap 13.

For the cap 13, Ni—Fe alloy, Kovar, CuW, Ni, Co, Fe, brass, or the like can be used. In particular, Ni, Fe—Ni alloy, Kovar, or the like, having high thermal conductivity and allowing resistance welding with the use of a projection is preferable.

Examples of the materials of the support member 14 include silicon carbide, aluminum oxide, silicon nitride, aluminum nitride, titanium oxide, tantalum oxide, ceramics such as cermet, high melting temperature metals such as tungsten, tantalum, molybdenum, and kovar. Among those, a material containing aluminum oxide that has high thermal conductivity and high reflectance is preferably employed.

The shape, size or the like of the package 5 can be appropriately determined according to the usage, and intended function/effect.

First and Second Photodetectors 3 and 4

The photodetector 3 is an element configured to detect excitation light emitted from the semiconductor light emitting element. The photodetector 4 is an element configured to detect fluorescent light obtained by converting the wavelength of the excitation light by the fluorescent material. For example, as described above, a light emitting device configured to produce a white light may include the photodetector 3 configured to detect blue excitation light and the photodetector 4 configured to detect yellow fluorescent light emitted from a fluorescent material that is excited by the blue light.

For the first and second photodetectors 3 and 4, semiconductor photodetectors such as Si photoodiode, GaAs photodiode, InGaAs photodiode, and InGaAsP photodiode, phototubes, and photomultiplier tubes can be employed.

Examples of preferable semiconductor photodetectors include a semiconductor photodetector having in the order from its light-receiving surface side, a semiconductor photodetector having a anti-reflection film, an n-type InP substrate, a first absorption layer of InGaAsP, an n-type InP buffer layer, a second absorption layer of n-type InGaAs, a p-type light diffusing layer region, and a non-reflective film. The semiconductor photodetector is configured such that light having a wavelength longer than the bandgap wavelength of the InGaAsP first absorption layer that reaches the n-type InGaAsP second absorption layer is extracted as photoelectric current and light having a wavelength shorter than the bandgap wavelength of the InGaAsP first absorption layer is absorbed by the InGaAsP first absorption layer.

Each of the photodetectors 3 and 4 may be configured to detect only a certain wavelength of visible light, or two photodetectors configured to detect the same wavelength may be used in combination with band pass filters that allow light of different wavelength regions to pass through, to provide the photodetectors 3, 4, as described later below. With this arrangement, efficient detection of the excitation light emitted from the semiconductor light emitting element 1 and the fluorescent light that is wavelength converted light by the wavelength converting member 2 become possible.

For example, it is preferable that the first photodetector 3 is configured to photoelectrically convert and detect the excitation light emitted from the semiconductor light emitting element 1 to be used, but is not sensitive to the fluorescent light emitted from the fluorescent material. It is preferable that the second photodetector 4 is configured to photoelectrically convert and detect the fluorescent light emitted from the fluorescent material to be used, but is not sensitive to the excitation light emitted from the semiconductor light emitting element 1. In the present specification, the expression "configured to photoelectrically convert and detect certain light" means to have a sensitivity to a portion of the light, more specifically, the conversion efficiency to the wavelength of the light is preferably 10% or greater, more preferably 30% or greater.

With the use of one or more photodetectors configured to detect light of a certain wavelength range, abnormal state of wavelength conversion caused by overall damage or detachment of the wavelength converting member 2 can be detected, but when the excitation light from the semiconductor light emitting element 1 is converted by the wavelength converting member 2, detection of partial damage or functional deterioration of the wavelength converting member become 2 difficult to detect. Also, in the case of overall damage or detachment of the wavelength converting member, the excitation light from the semiconductor light emitting element 1 may be reflected by other component of the light emitting device 10 and may enter the photodetector(s). Thus, as described above, photodetectors to detect at least two wavelength ranges are preferably employed.

The first and second photodetectors 3, 4 are disposed in the package 5 as shown in FIG. 1B. In the light emitting device 10, of the excitation light emitted from the emission end surface of the semiconductor light emitting element 1, a portion of the excitation light enters the wavelength converting member 2 and reflected by the fluorescent material in the wavelength converting member 2 and without being wavelength converted, returns to the package 5 and enters the first photodetector 3, and an another portion of the excitation light is wavelength converted by the fluorescent material in the wavelength converting member 2 and reflected in the wavelength converting member 2 and enters the second photodetector 4. Therefore, the first and second photodetectors 3, 4 are fixed at locations where light from the wavelength converting member 2 can be detected. More specifically, the photodetectors can be disposed at the locations such as on the upper surface of the base part 11 of the stem, on the upper surface of the block part 12 of the stem, on the inner wall defining the cap 13. Each of the photodetectors may be fixed to the location via a sub-mount.

Figure 2:
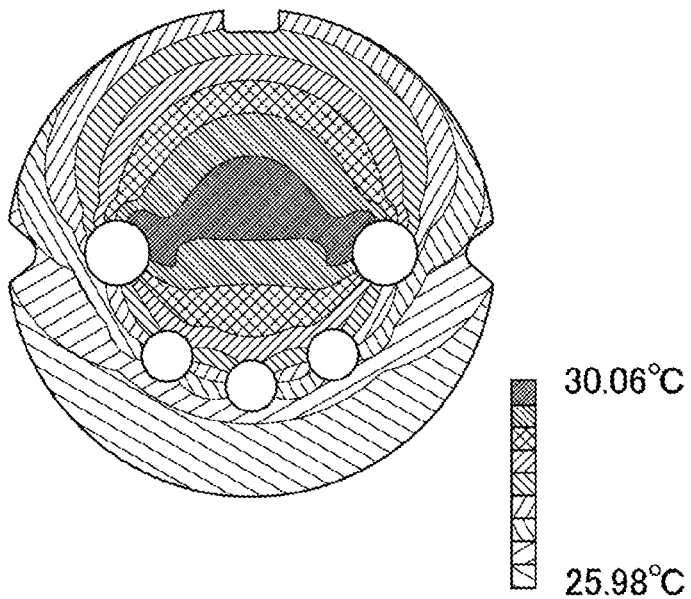
FIG. 2 is a diagram showing a simulation result of thermal distribution near the stem of the light emitting device according to the first embodiment.

A gradual difference in the temperature will be created in the base part 11 of the stem, in which, the upper surface side in FIG. 2 of the semiconductor light emitting element 1, that is a portion of the base part 11 of the stem located opposite to the block part 12 of the stem becomes highest temperature, for example, as shown in the heat dissipation simulation result in a plan view of the base part 11 of the stem in FIG. 2. For this reason, the first and second photodetectors 3, 4 are preferably disposed close to each other. Thus, difference in the effect of the temperature difference in the light emitting device and/or external light to the photosensitivity between the first and second photodetectors 3, 4 can be reduced. As shown in FIG. 2, the temperature distribution in a plan view of the base part 11 of the stem is line-symmetrical with respect to a center line passing through a center of the semiconductor light emitting element 1, in other words, a straight line passing through a center of the semiconductor light emitting element 1 and perpendicular to a mounting surface of the semiconductor light emitting element 1. Therefore, the first and second photodetectors 3, 4 are preferably disposed line symmetrical to the straight line and close to each other. In this configuration, the expression "close to each other" refers to a distance smaller than a distance between either of the photodetectors 3, 4 and the semiconductor laser element 1. When a semiconductor laser element is used as the semiconductor light emitting element 1, the first and second photodetectors 3, 4 are preferably disposed at locations avoiding directly under the semiconductor light emitting element 1, such that a laser light (so called monitor light) from the end surface on the opposite side of the main emission end surface of the semiconductor laser element does not enter the first and second photodetectors 3, 4. That is, the first and second photodetectors 3, 4 are preferably located outside of the region corresponding to the divergence angle of the laser light from the end surface on the opposite side of the main emission end surface of the semiconductor laser element. The first and second photodetectors 3, 4 are preferably disposed at the same height (i.e., distance from the upper surface of the stem). This allows for immediate detection of abnormality in the light due to occurrence of detachment, damage, or the like of the wavelength converting member 2. As described below, simultaneously with detection of abnormality in the light, the operation of the semiconductor light emitting element 1 is stopped. Thus, external release of the excitation light that poses a threat to human body can be avoided.

The light emitting device according to the first embodiment may further include one or more photodetectors such as a photodetector sensitive to light of the same wavelength as those described above and/or a photodetector sensitive to light of different wavelength.

Band Pass Filter

The first photodetector 3 and the second photodetector 4 may each be provided with a band pass filter. A band pass filter is configured to allow light of a certain wavelength region to pass through and to block light of other wavelength regions. Examples of band pass filters include a short-pass filter that allows only light having a wavelength equal to or shorter than a predetermined wavelength to pass through, and a long-pass filter that allows only light having a wavelength equal to or longer than a predetermined wavelength to pass through. The first photodetector 3 is preferably provided with a band pass filter that allows the excitation light emitted from the semiconductor light emitting element to pass through and blocks the fluorescent light that has been wavelength converted by the fluorescent material contained in the wavelength converting member. The second photodetector 4 is preferably provided with a band pass filter that allows the fluorescent light that has been wavelength converted by the fluorescent material contained in the wavelength converting member to pass through, and blocks the excitation light emitted from the semiconductor light emitting element. The band pass filters may be attached to the corresponding photodetectors 3, 4, or disposed at a predetermined distance from the corresponding photodetectors 3, 4.

Each of the band pass filters preferably includes a dielectric multilayer film, which can be formed with existing light-transmissive film materials such as oxides, nitrides, and halides. Specific examples of such materials include KRS-5 (thallium bromoiodide: a mixed crystal of TlBr (45.7%) and TlI (54.3%)) and KRS-6 (thallium bromochloride: a mixed crystal of TlBr (29.8%) and TlCl (70.2%)).

A band pass filter using KRS-5 blocks blue light, blue-violet light, or ultraviolet light and allows passing of light having a wavelength longer than about 500 nm, such as green light, yellow light, orange light, red light, and infrared light. When a semiconductor light emitting element to emit blue, blue-violet, or ultraviolet laser light is used, light whose wavelength has not converted by a fluorescent material has an extremely sharp single peak, and thus blocked by this band pass filter. Meanwhile, at least a portion of fluorescent light that has been wavelength converted by the fluorescent material has a broad spectrum that is allowed to pass the band pass filter.

A band pass filter using KRS-6 blocks blue-violet light or ultraviolet light and allows passing of light having a wavelength longer than about 410 nm, such as yellow light, blue light, green light, red light, and infrared light. Accordingly, when a semiconductor light emitting element to emit blue-violet or ultraviolet laser light is used, light whose wavelength has not converted by a fluorescent material is blocked by this band pass filter. Meanwhile, at least a portion of fluorescent light that has been wavelength converted by the fluorescent material has a broad spectrum that is allowed to pass the band pass filter.

Controller

Figure 4:
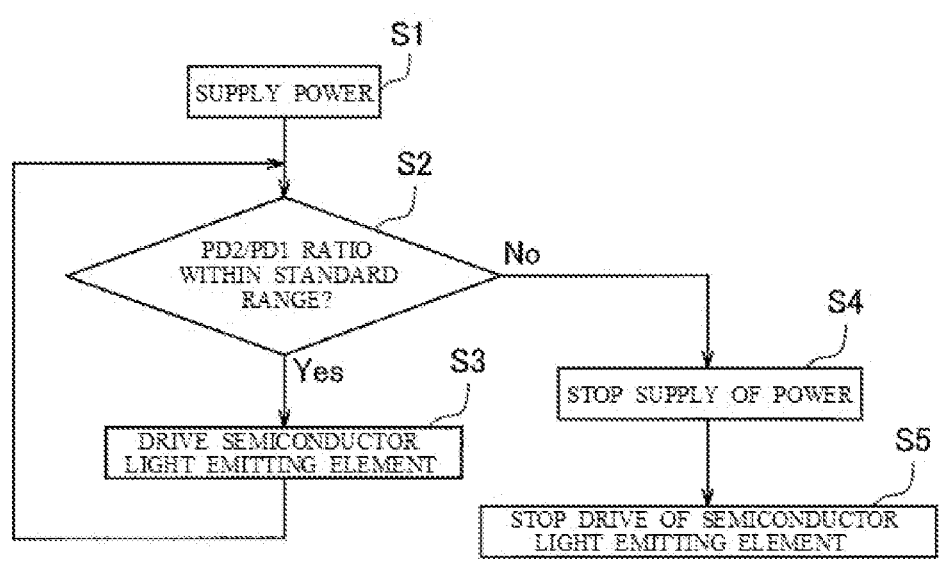
FIG. 4 is a flowchart illustrating operations of the light emitting device according to the first embodiment.

As shown in FIGS. 3 and 4, the light emitting device 10 preferably further include a controller configured to stop light emission of the semiconductor light emitting element 1 based on a ratio between a detected value (PD1) of the excitation light from the first photodetector 3 and a detected value (PD2) of the fluorescent light from the second photodetector 4. Accordingly, the operation of the semiconductor light emitting element can be stopped simultaneously with detection of abnormality in the light. Thus, external release of the excitation light that poses a threat to human body can be avoided.

The controller includes a determiner configured to determine whether a ratio between a detected value (PD1) of the excitation light detected by the first photodetector 3 and a detected value (PD2) of the fluorescent light detected by the second photodetector 4 belongs to a certain range, and a controller configured to output a step signal to stop the operation of the semiconductor light emitting element based on the determination output from the determiner as shown in FIG. 3. In a state absent of abnormality in the fluorescent material, although the detected value (PD1)) of the first photodetector 3 configured to detect the excitation light and the detected value (PD2) of the second photodetector 4 configured to detect the fluorescent light vary by temperature, the detected value (PD1) of the first photodetector 3 and the detected value (PD2) of the second photodetector 4 are approximately proportional. Thus, the ratio between the detected values of the first photodetector 3 and the second photodetector 4 does not significantly change. Meanwhile, upon occurrence of abnormality in the fluorescent material, the ratio of the detected values between the first and second photodetectors 3, 4 exhibits a significant change. In other words, when the ratio (PD2/PD1) of the values detected by the first and second photodetector 3,4 exceeds a predetermined standard range (for example, within a ±10% range of PD2/PD1 at a normal temperature, which is 25° C. in the present specification, in a state absent of abnormality in the fluorescent material), determination is made as the wavelength converting member being damaged due to some cause, and the operation of the semiconductor light emitting element 1 is stopped. The standard range is set to include the values of PD2/PD1 at a low temperature and a high temperature each in a state absent of abnormality in the fluorescent material.

Instead of configuring the controller to output a stop signal to the LD driver, a relay switch of self-holding type is interposed in a supply line of the power and the controller may be adapted to block the supply of the power.

The driver is configured to supply power to the semiconductor light emitting element when a driving signal is inputted from the LD driver of the controller.

That is, as shown in FIG. 4, in Step S1, when a predetermined operation is performed by an operator, a driving signal is outputted from the controller to the driver, and power is supplied from the driver to the semiconductor light emitting element 1. Accordingly, the semiconductor light emitting element 1 is driven.

The excitation light emitted from the semiconductor light emitting element 1 is irradiated on the fluorescent material of the wavelength converting member, and fluorescent light having a wavelength longer than the wavelength of the excitation light is emitted from the fluorescent material. A different portion of excitation light emitted from the semiconductor light emitting element is not wavelength-converted but is diffused by the fluorescent material and becomes scattering light. Accordingly, the fluorescent light and the scattering light are mixed and extracted to the outside of the light emitting device 10 as a white light. Meanwhile, a portion of wavelength converted light by the fluorescent material in the wavelength converting member is reflected and incident on the second photodetector 4 in the package. A portion of the excitation light that is not wavelength-converted in the wavelength converting member is repetitively reflected in the wavelength converting member and/or in the package, or the like, and a portion of the reflected light is incident on the first photodetector 3 in the package. In Step S2, the values of the signals PD1 and PD2 are obtained and whether the ratio of PD2/PD1 is within the standard range is determined, and if it is within the range, driving of the semiconductor light emitting element is continued in Step S3. Thereafter return to Step S2, the determination according to Step S2 is repeated.

Meanwhile, if a damage occurs in the wavelength converting due to some cause, even when the laser light emitted from the semiconductor light emitting element 1 is irradiated on the wavelength converting member, most of the laser light is released to the outside in situ without converted to a fluorescent light by the fluorescent material, or repetitively reflected in the wavelength converting member or in the package and a portion of the reflected light is incident to the first photodetector 3. In this case, the ratio of PD2/PD1 is not determined as within the standard range, and in Step 4, the supply of power to the semiconductor light emitting element 1 is stopped, and in Step, driving of the semiconductor light emitting element is stopped.

The term "damage in the wavelength converting member" refers to functional degradation of the fluorescent material due to chipping off of a portion, entire detachment, discoloration of the surface, a burn of the fluorescent material, or the like, which results in a detectable or significant decrease in the fluorescent light converted from the excitation light.

As described above, the light emitting device 1 according to the first embodiment includes photodetectors configured to detect light of at least two different ranges of wavelengths: the first photodetector configured to detect the excitation light and the second photodetector configured to detect the fluorescent light. Accordingly, simultaneous detection of the excitation light and the fluorescent light is realized, and thus immediate detection of abnormality in the fluorescent material such as cracking or detachment of the fluorescent material can be achieved. In particular, cracking, degradation, or the like of the fluorescent material can be found by detecting a decrease in the luminous flux of the fluorescent material due to degradation in thermal characteristics. According to the detection of the abnormality, appropriate measures such as stopping the operation of the semiconductor light emitting element can be taken, and thus the light emitting device of high optical output with high safety and high reliability can be obtained.

Other Component Members

The light emitting device according to the first embodiment may further include one or more other component members, for example, a light-control member such as a prism, a lens such as a condensing lens 7 or a collimating lens, or an optical fiber member, which are used singly or in combination. Also, light emitted from the wavelength converting member may be condensed by using a lens or the like. With the use of such member(s), the size and shape of light spot of laser light or light emitted from the wavelength converting member can be adjusted.

Second Embodiment

Figure 5A:
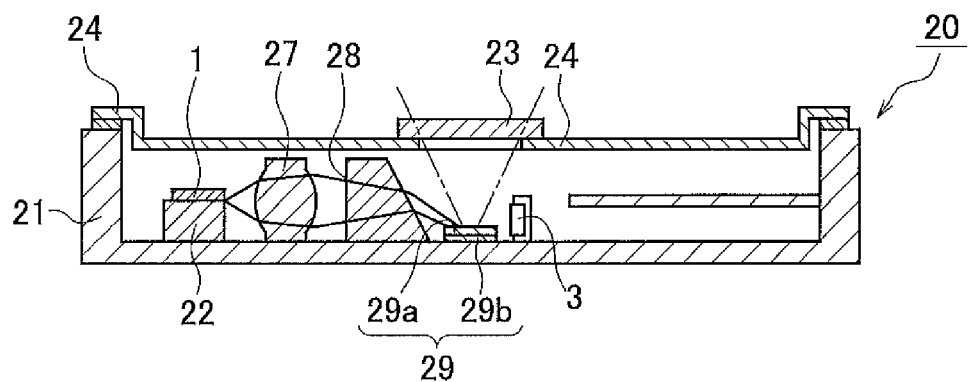
FIG. 5A is a schematic cross-sectional view of a light emitting device according to a second embodiment.
Figure 5B:
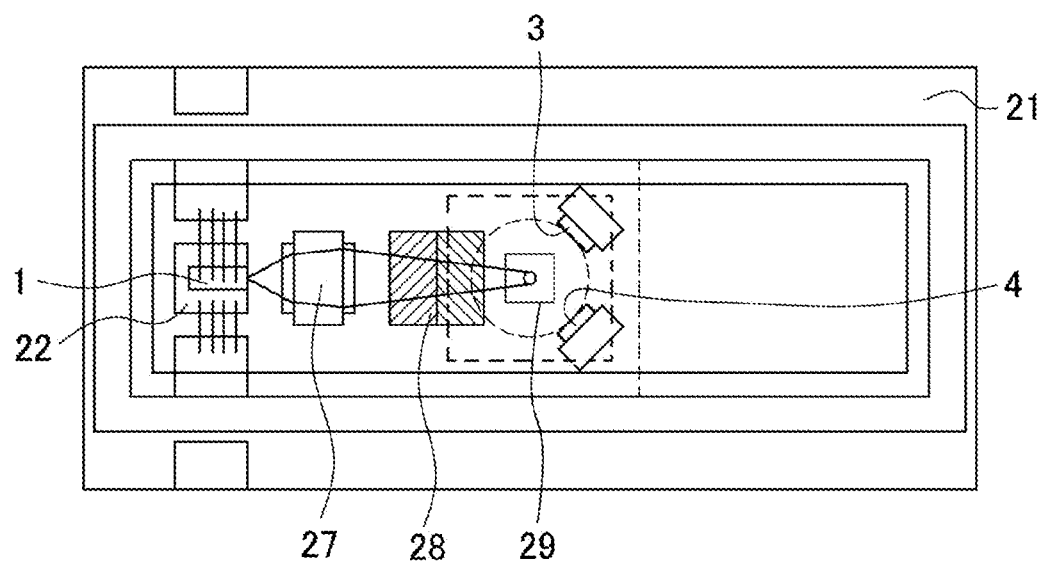
FIG. 5B is a schematic plan view of the light emitting device according to the second embodiment, where a cover is not shown.

As shown in FIG. 5A and FIG. 5B, the light emitting device 20 according to a second embodiment is a reflection-type light emitting device and includes a semiconductor light emitting element 1 to emit excitation light, a wavelength converting member 29 to emit fluorescent light, a first photodetector 3 to detect the excitation light, and a second photodetector 4 to detect the fluorescent light. The semiconductor light emitting element 1, the wavelength converting member 2, the first photodetector 3, and the second photodetector 4 are disposed in the package 5. The semiconductor light emitting element 1 is disposed on a submount 22.

The package in the light emitting device 20 includes a housing 21, a cover 24 covering an upper surface of the housing 21 and having a window for extracting light, and a light-transmissive cap 23 hermetically sealing and protecting the window. The cover 24 can be formed with a material similar to the material of the cap of the package described above.

Examples of the materials of the housing 21 include, in addition to a material similar to the material of the stem of the package as described above, silicon carbide, aluminum oxide, silicon nitride, aluminum nitride, titanium oxide, titanium oxide, ceramics such as cermet. Such a metal or ceramics may be used as a base material and plating of Au, Ag, At or the like may be applied on the entire surface or a portion of the surface of the base material to ensure the electrically conducting property. The housing 21 will be bonded with the cap 24 so that at least the surfaces of the housing 21 is preferably made of a material that has good bonding property with the material of the surface of the cap 24.

For the light-transmissive cap 23, a member having a linear expansion coefficient similar to that of the housing 24 is preferably selected, and with this, air-tightness with the housing 21 can be enhanced. More specifically, glass material such as borosilicate glass can be used for the transparent cap 23.

The wavelength converting member 29) is formed with a layered structure that includes a light-transmissive layer 29a located at an upper side to allow light to pass through upward and a light-reflecting layer 29b located at a lower side. The light-transmissive layer 29a is formed with a light-transmissive member containing the fluorescent material described above. The light-reflecting layer 29b can be formed with, for example, a single-layer structure or a multilayer structure made of light-reflecting metal(s) such as Ag, a dielectric multilayer film, a combination of those, or the like.

In order to appropriately irradiate the excitation light to the wavelength converting member 29, a lens 27 and a prism 28 can be arranged between the wavelength converting member 29 and the semiconductor light emitting element 1.

In the package having such a configuration, the first and second photodetectors are disposed in the package. The first and second photodetectors 3, 4 can be disposed in the housing 21 or on the inner wall etc., of the cover 24, and can be fixed via a heat sink at each corresponding location. It is particularly preferable to dispose the first and second photodetectors at locations where stray light from the semiconductor light emitting element 1 is not incident.

The configuration as shown in FIG. 5A and FIG. 5B, a portion of the wavelength converting member 29 located forward of the semiconductor light emitting element 1 and irradiated with the excitation light. The temperature distribution in this configuration becomes substantially line-symmetrical with respect to a straight line connecting a center portion of the wavelength converting member 29 and the semiconductor light emitting element 1, on other words, substantially line-symmetrical with respect to a straight line passing through the center of the semiconductor light emitting element 1. Accordingly, it is preferable to closely dispose the first and second photodetectors 3, 4 to each other, and also to locations line symmetrical to the straight line passing through the center of the semiconductor light emitting element 1. In this configuration, the expression "close to each other" refers to a distance smaller than a distance between either of the photodetectors 3, 4 and the center of the wavelength converting member 29. The first and second photodetectors 3, 4 are preferably disposed at locations avoiding direct incident of the light from the semiconductor light emitting element 1 and at the same height (i.e., distance from the bottom surface of the housing).

The excitation light emitted from the semiconductor light emitting element 1 passes through a lens 27 configured to condense or collimated the excitation light, and passes through a prism 28 configured to refract light from the lens 27, and is irradiated to the wavelength converting member 29 from an obliquely-upward direction, then, reflected upward at the light-reflecting layer of the wavelength converting member 29 and extracted to the outside from the window.

In the light emitting device 20 having such a configuration, similar to that in the light emitting device 10 of the first embodiment, abnormality in the light can be immediately detected upon occurrence of detachment or damage, degradation, or the like of the wavelength converting member 2. Further, simultaneously with detection of abnormality in the light, the operation of the semiconductor light emitting element 1 is stopped. Thus, external release of the excitation light that poses a threat to human body can be avoided.

The light emitting device according to the present disclosure can be suitably used for various display devices, luminaries, displays, backlight light sources of liquid crystal displays, further, for image reading apparatus for photocopiers, scanners, or the like, projectors, laser display devices, endoscopes, vehicular headlights, bar code scanners, or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a semiconductor light emitting element to emit an excitation light;
   a wavelength converting member to emit fluorescent light upon being irradiated with the excitation light;
   a package supporting the semiconductor light emitting element and the wavelength converting member; and
   a first photodetector configured to detect the excitation light and a second photodetector configured to detect the fluorescent light, located in the package.

2. The light emitting device according to claim 1, further comprising a controller configured to stop light emission of the semiconductor light emitting element based on a ratio between a detected value of the excitation light from the first photodetector and a detected value of the fluorescent light from the second photodetector.

3. The light emitting device according to claim 2, wherein the first photodetector to detect the excitation light comprises a band pass filter configured to pass the excitation light, and the second photodetector to detect the fluorescent light comprises a band pass filter configured to pass the fluorescent light.

4. The light emitting device according to claim 3, wherein the first photodetector and the second photodetector are disposed close to each other.

5. The light emitting device according to claim 2, wherein the first photodetector and the second photodetector are disposed close to each other.

6. The light emitting device according to claim 1, wherein the first photodetector to detect the excitation light comprises a band pass filter configured to pass the excitation light, and the second photodetector to detect the fluorescent light comprises a band pass filter configured to pass the fluorescent light.

7. The light emitting device according to claim 6, wherein the first photodetector and the second photodetector are disposed close to each other.

8. The light emitting device according to claim 1, wherein the first photodetector and the second photodetector are disposed close to each other.

9. The light emitting device according to claim 1, wherein the wavelength converting member is a light transmissive member.

10. The light emitting device according to claim 1, wherein the wavelength converting member has a layered structure of a light-transmissive layer and a light-reflecting layer.

11. The light emitting device according to claim 1, wherein the light emitting element is a semiconductor laser element.

12. The light emitting device according to claim 11, wherein the first photodetector and the second photodetector are disposed such that a laser light from an end surface opposite side of a main emission end surface of the semiconductor laser element does not enter the first photodetector and the second photodetector laser.

13. The light emitting device according to claim 1, wherein the second photodetector is configured to photoelectrically convert and detect the fluorescent light, and is not sensitive to the excitation light.

14. The light emitting device according to claim 1, wherein the package includes a stem having a base part and a block part, a cap, and a support.

15. The light emitting device according to claim 14, wherein the semiconductor light emitting element is fixed via a sub-mount on a lateral surface of the block part of the stem.

16. The light emitting device according to claim 14, wherein the cap is bonded on an upper surface of the base part near outer periphery of the base part of the stem.

17. The light emitting device according to claim 14, wherein the semiconductor light emitting element, the first photodetector and the second photodetector are covered by the cap.

18. The light emitting device according to claim 1, wherein the package includes
   a housing,
   a cover covering an upper surface of the housing and having a window for extracting light, and
   a light-transmissive cap hermetically sealing and protecting the window.

19. The light emitting device according to claim 18, wherein the semiconductor light emitting element, the first photodetector and the second photodetector are covered by the cover and the light transmissive cap.

* * * * *